(12) United States Patent
Kim (10) Patent No.: US 9,450,018 B2
(45) Date of Patent: Sep. 20, 2016

(54) LIGHT-EMITTING DEVICE AND LIGHT-EMITTING DEVICE PACKAGE

(71) Applicant: SAMSUNG ELECTRONICS CO., LTD., Suwon-Si, Gyeonggi-do (KR)

(72) Inventor: Jung-sung Kim, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/593,733

(22) Filed: Jan. 9, 2015

(65) Prior Publication Data

US 2015/0221820 A1    Aug. 6, 2015

(30) Foreign Application Priority Data

Feb. 5, 2014 (KR) .......................... 10-2014-0013320

(51) Int. Cl.

| | | |
|---|---|---|
| *H01L 29/06* | (2006.01) | |
| *H01L 27/15* | (2006.01) | |
| *H01L 33/24* | (2010.01) | |
| *H01L 33/44* | (2010.01) | |
| *H01L 23/00* | (2006.01) | |
| H01L 33/32 | (2010.01) | |
| H01L 33/18 | (2010.01) | |
| H01L 33/38 | (2010.01) | |

(52) U.S. Cl.
CPC ............. *H01L 27/153* (2013.01); *H01L 24/06* (2013.01); *H01L 33/24* (2013.01); *H01L 33/44* (2013.01); *H01L 33/18* (2013.01); *H01L 33/32* (2013.01); *H01L 33/382* (2013.01); *H01L 2224/0603* (2013.01); *H01L 2224/48091* (2013.01)

(58) Field of Classification Search
CPC ....... H01L 33/08; H01L 33/24; H01L 33/44; H01L 33/32
USPC .......................................................... 257/13
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,720,584 B2 | 4/2004 | Hata et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |

(Continued)

FOREIGN PATENT DOCUMENTS

| | | |
|---|---|---|
| JP | 2007-123398 A | 5/2007 |
| JP | 2012-221770 A | 11/2012 |

(Continued)

*Primary Examiner* — Douglas Menz
(74) *Attorney, Agent, or Firm* — Muir Patent Law, PLLC (57) ABSTRACT

There are provided a light-emitting device and a light-emitting device package capable of simultaneously controlling brightness and correlated color temperature (CCT) of an illumination apparatus using the same. The light-emitting device includes a plurality of light-emitting units each including an active layer of multi quantum wells (MQW) and an electrode unit electrically connected to the light-emitting units. Brightness and CCT of light components generated by the plurality of light-emitting units simultaneously change in accordance with an amount of current applied by an external input power source connected to the light-emitting units through the electrode unit.

7 Claims, 6 Drawing Sheets

(56) References Cited

U.S. PATENT DOCUMENTS

| | | |
|---|---|---|
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,821,023 B2 | 10/2010 | Yuan et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,876 B2 | 3/2013 | Kim |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 2012/0081033 A1 | 4/2012 | Sun et al. |
| 2012/0256560 A1 | 10/2012 | Yun |
| 2013/0049632 A1 | 2/2013 | Kim |
| 2013/0140521 A1 | 6/2013 | Gilet et al. |
| 2013/0221384 A1* | 8/2013 | Saito ............ H01L 27/156 257/88 |
| 2013/0300305 A1* | 11/2013 | Wray ............ H05B 33/0818 315/210 |

FOREIGN PATENT DOCUMENTS

| | | |
|---|---|---|
| KR | 10-2009-0041834 A | 4/2009 |
| KR | 10-2010-0082215 A | 7/2010 |
| KR | 10-0970611 B1 | 7/2010 |
| KR | 10-2011-0014521 A | 2/2011 |
| KR | 10-2011-0014890 A | 2/2011 |
| KR | 10-2013-0016815 A | 2/2013 |
| KR | 10-2013-0024052 A | 3/2013 |

* cited by examiner

LIGHT-EMITTING DEVICE AND LIGHT-EMITTING DEVICE PACKAGE

CROSS-REFERENCE TO RELATED APPLICATIONS

This application claims the benefit of Korean Patent Application No. 10-2014-0013320, filed on Feb. 5, 2014, in the Korean Intellectual Property Office, the disclosure of which is incorporated herein in its entirety by reference.

TECHNICAL FIELD

The inventive concept relates to a light-emitting device and a light-emitting device package, and more particularly, to a light-emitting device and a light-emitting device package capable of changing brightness and correlated color temperature (CCT) of illumination.

BACKGROUND

A light-emitting device and a light-emitting device package are used for various products such as small household appliances, interior products, illumination apparatuses, and electric apparatuses. In using the light-emitting device and the light-emitting device package for illumination, dimming is important. Dark and bright places are differently used and it is necessary to control brightness and CCT of illumination in accordance with uses of the dark and bright places. In the dimming, a method of controlling an amount of generated light in accordance with current applied to the light-emitting device and the light-emitting device package to control brightness is currently used.

SUMMARY

According to an aspect of the instant application, there is provided a light-emitting device including a plurality of light-emitting units each including an active layer of multi quantum wells (MQW) and an electrode unit electrically connected to the light-emitting units. Brightness and correlated color temperature (CCT) of light components generated by the plurality of light-emitting units simultaneously change in accordance with an amount of current applied by an external input power source connected to the light-emitting units through the electrode unit.

The brightness and CCT simultaneously increase with an increase in the amount of the current applied by the external input power source.

The CCT automatically changes in a range between 2,500K and 7,500K in accordance with a change in the amount of the current applied by the external input power source.

The plurality of light-emitting units are nano-structured. MQWs in the plurality of light-emitting units generate light components with different wavelengths so that the CCT changes in accordance with a combination of the light components with the different wavelengths.

The plurality of light-emitting units include a first group in which the light-emitting units are separately arranged by a first distance, a second group in which the light-emitting units are separately arranged by a second distance, and a third group in which the light-emitting units are separately arranged by a third distance. The light components with the different wavelengths are generated by the plurality of light-emitting units in the first, second, and third groups.

The plurality of light-emitting units include InGaN. The plurality of light-emitting units generate the light components with the different wavelengths in accordance with composition ratios of In.

The plurality of light-emitting units include InGaN. The plurality of light-emitting units include a first group in which In has a first composition ratio, a second group in which In has a second composition ratio, and a third group in which In has a third composition ratio. The plurality of light-emitting units in the first, second, and third groups generate the light components with the different wavelengths.

The light-emitting unit is formed of a thin film and further includes a first nitride-based semiconductor layer formed under the active layer and a second nitride-based semiconductor layer formed on the active layer. The active layer includes InGaN. The active layer includes first, second, and third regions in which composition ratios of In included therein are different from each other. The active layer in the first, second, and third regions generates light components with first, second, and third wavelengths. The CCT changes in accordance with a combination of the light components with the first, second, and third wavelengths.

According to another aspect, the instant application describes a light-emitting device package including a plurality of light-emitting devices including a plurality of light-emitting units for generating light components with a specific wavelength and a driving circuit electrically connected to the plurality of light-emitting devices to control an amount of current applied to the plurality of light-emitting devices in accordance with an external control signal. The plurality of light-emitting devices are connected in parallel. Brightness and correlated color temperature (CCT) of the generated light components simultaneously change in accordance with a magnitude of driving current applied to the plurality of light-emitting devices through the driving circuit.

The number of light-emitting devices is 2 to 5.

The brightness and CCT of the generated light components increase as a value of the current applied from the driving circuit increases.

The plurality of light-emitting units are nano-structured. Multi quantum wells (MQWs) in the plurality of light-emitting units generate light components with different wavelengths so that CCT changes in accordance with a combination of the light components with the different wavelengths generated by the plurality of light-emitting devices.

The plurality of light-emitting units are nano-structured. The plurality of light-emitting units are arranged by different distances so that wavelengths of the generated light components are different from each other and the CCT of the generated light components changes in accordance with the combination of the light components with the different wavelengths.

The light-emitting unit is formed of a thin film. The active layer includes InGaN. Light components with different wavelengths are generated in accordance with composition ratios of In of the active layer and CCT changes in accordance with a combination of the light components with the different wavelengths.

The plurality of light-emitting devices are hexagonally arranged.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Hereinafter, exemplary implementations of the present disclosure will be described in detail with reference to the accompanying drawings. The disclosure may, however, be exemplified in many different forms and should not be construed as being limited to the specific implementations set forth herein. Rather, these implementations are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

It will also be understood that when an element is referred to as being "on" another element, it can be directly on the other element, or intervening elements may also be present. On the other hand, when an element is referred to as being "immediately on" or as "directly contacting" another element, it can be understood that intervening elements do not exist. Other expressions describing a relationship between elements, for example, "between" and "directly between" may be interpreted like the above.

It will be understood that, although the terms first and second, etc., may be used herein to describe various elements, these elements should not be limited by these terms. These terms are only used to distinguish one element from another element. For example, a first element may be named a second element and similarly a second element may be named a first element without departing from the scope of the inventive concept.

Unless otherwise defined, terms "include" and "have" are for representing that characteristics, numbers, steps, operations, elements, and portions described in the specification or a combination thereof. It may be interpreted that one or more other characteristics, numbers, steps, operations, elements, and portions or a combination thereof may be added.

Unless otherwise defined, all terms (including technical and scientific terms) used herein have the same meaning as commonly understood by one of ordinary skill in the art to which this inventive concept belongs.

Figure 1:
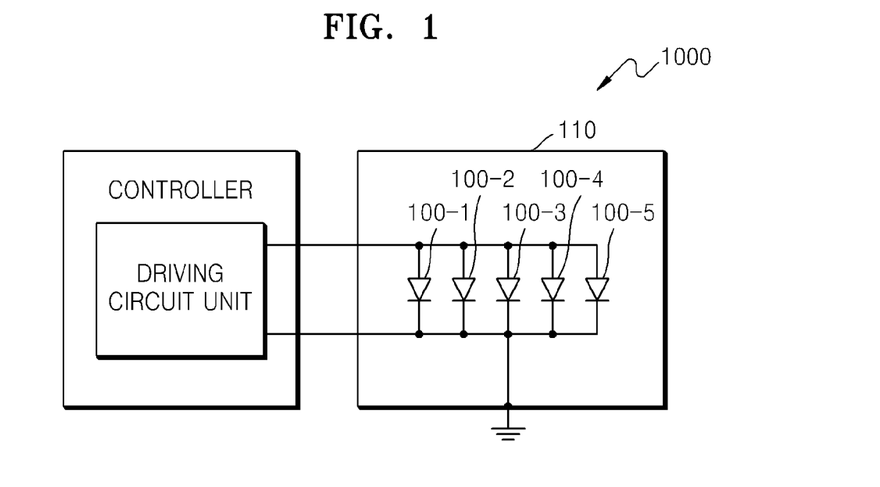
FIG. 1 is a circuit diagram of a light-emitting device package according to an exemplary embodiment of the inventive concept.

FIG. 1 is a circuit diagram of a light-emitting device package 1000 according to an exemplary embodiment of the inventive concept.

In the light-emitting device package 1000 a plurality of light-emitting devices 100-1 to 100-5 mounted on a substrate 110 are connected to a driving circuit unit in parallel. The driving circuit unit may be included in a controller and may receive a control signal from the controller to supply current to the plurality of light-emitting devices 100-1 to 100-5.

The plurality of light-emitting devices 100-1 to 100-5 may include light-emitting units that emit light components with different wavelengths in accordance with an amount of the input current. The number of light-emitting devices 100-1 to 100-5 is illustrated as being five in FIG. 1. However, the number of the light-emitting devices can be more or less depending on a specific application of the light-emitting device package 1000. In one specific example, at least one light-emitting device may be included in the light-emitting device package 1000. In addition, it is illustrated in FIG. 1 that the plurality of light-emitting devices 100-1 to 100-5 are connected to the driving circuit unit only in parallel. However, the plurality of light-emitting devices 100-1 to 100-5 may be serially connected to the driving circuit unit and may be connected to the driving circuit unit in a series-parallel structure.

The driving circuit unit may turn on the plurality of light-emitting devices 100-1 to 100-5 in accordance with a control signal received from the outside and may control a value of the current applied to the plurality of turned on light-emitting devices 100-1 to 100-5 to simultaneously change brightness components and correlated color temperature (CCT) of the light components generated by the plurality of light-emitting devices 100-1 to 100-5.

The driving circuit unit may apply the current to the light-emitting devices 100-1 to 100-5 in accordance with the control signal received from the controller. The controller receives the control signal from the outside to control the value of the current applied to the light-emitting devices 100-1 to 100-5. For example, an illumination apparatus formed of the light-emitting device package 1000 may be controlled to recognize brightness of a peripheral environment, in which the illumination apparatus is installed, and to apply current with a value that varies in accordance with the peripheral environment. An illumination product using the light-emitting device package 1000 may be used indoors in a conference room, an office, or a residential environment. For example, when dark illumination is required in a bedroom or the residential environment, in order to draw an atmosphere at which a user feels stable and comfortable, low brightness and CCT from about 2,700K to about 3,500K are required. In the office or the conference room, illumination of high brightness and high CCT of no less than 6,500K is required. Therefore, the illumination apparatus using the light-emitting device package 1000 may be controlled to apply the current with a value that varies in accordance with the peripheral environment.

Figure 2:
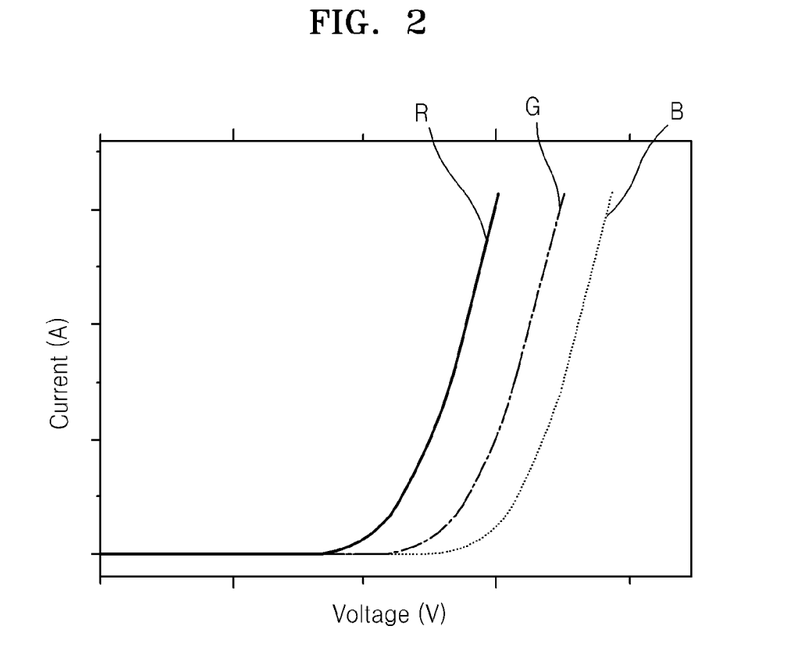
FIG. 2 is a current-voltage graph in accordance with wavelengths of light components emitted by a light-emitting device according to an exemplary embodiment of the inventive concept.

FIG. 2 is a current-voltage graph in accordance with wavelengths of light components emitted by the light-emitting devices 100-1 to 100-5 and the light-emitting device package 1000 according to the inventive concept.

Referring to FIG. 2, when the plurality of light-emitting devices 100-1 to 100-5 that emit light components with different wavelengths are connected in parallel in one package, the order in which the plurality of light-emitting devices 100-1 to 100-5 are turned on may vary in accordance with a value of applied current. Specifically, as the value of the current applied from the outside increases, light is first emitted from a region with a long wavelength and is later emitted from a region with a short wavelength. Such a characteristic is noted from the fact that currents with different values flow although a number of light-emitting diodes connected in parallel have the same forward voltage value in a parallel circuit.

The plurality of light-emitting devices 100-1 to 100-5 generate light components with different wavelengths in accordance with the value of the current applied from the outside. When the plurality of light-emitting devices 100-1 to 100-5 have the same forward voltage value, current with a larger value is output from a red (R) region with a longer wavelength, current with a smaller value is output from a green (G) region with a shorter wavelength, and current with the smallest value is output from a blue (B) region with the shortest wavelength. By using this, the wavelengths of the light components generated by the plurality of light-emitting devices 100-1 to 100-5 are controlled while gradually increasing the value of the current applied to the plurality of light-emitting devices 100-1 to 100-5 to control CCT.

Figure 3:
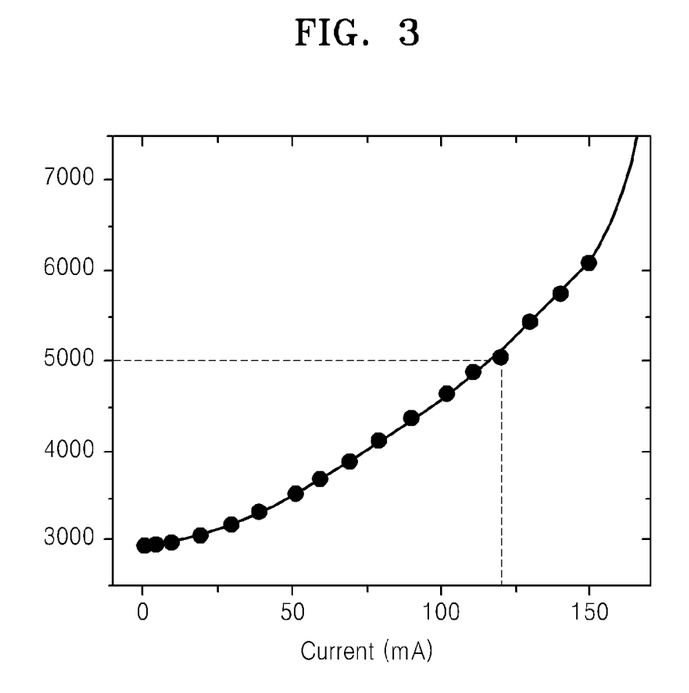
FIG. 3 is a graph illustrating a change in correlated color temperature (CCT) with respect to current applied to a light-emitting device according to an exemplary embodiment of the inventive concept.

FIG. 3 is a graph illustrating a change in CCT with respect to current applied to the light-emitting devices 100-1 to 100-5 and the light-emitting device package 1000 according to the inventive concept.

Referring to FIG. 3, outputs of light components generated by the plurality of light-emitting devices 100-1 to 100-5, that is, optical outputs change with increase in a value of current applied from the outside. Therefore, when the current value is small, light is emitted only from a red (R) region with a long wavelength and, as the current value gradually increases, light is emitted from a blue (B) region with a short wavelength. Therefore, CCT of the light components generated by the plurality of light-emitting devices 100-1 to 100-5 may increase with the increase in the value of the current applied from the outside.

CCT is correlated brightness, that is, a brightness ratio of R, G, and B. When brightness components of one or more of the three colors are increased or reduced, white or daylight blue may look red or blue. When the plurality of light-emitting devices 100-1 to 100-5 emit light components with different wavelengths and current with a small value is applied, white light of about 2,500K is emitted. As the value of the applied current increases, white light of about 6,500K may be emitted from a daylight blue region. By the above-described principle, when a value of the current applied to the plurality of light-emitting devices 100-1 to 100-5 is from about 0 mA to about 20 mA, cozy illumination having low brightness and low CCT of about 3,000K may be formed and, when the value of the current applied to the plurality of light-emitting devices 100-1 to 100-5 is no less than 150 mA, illumination having high brightness and high CCT of about 6,500K, which is suitable for an office environment or a work environment, may be formed. According to an embodiment of the inventive concept, the light components generated by the plurality of light-emitting devices 100-1 to 100-5 may have CCT from about 2,500K to about 7,500K.

Figure 4:
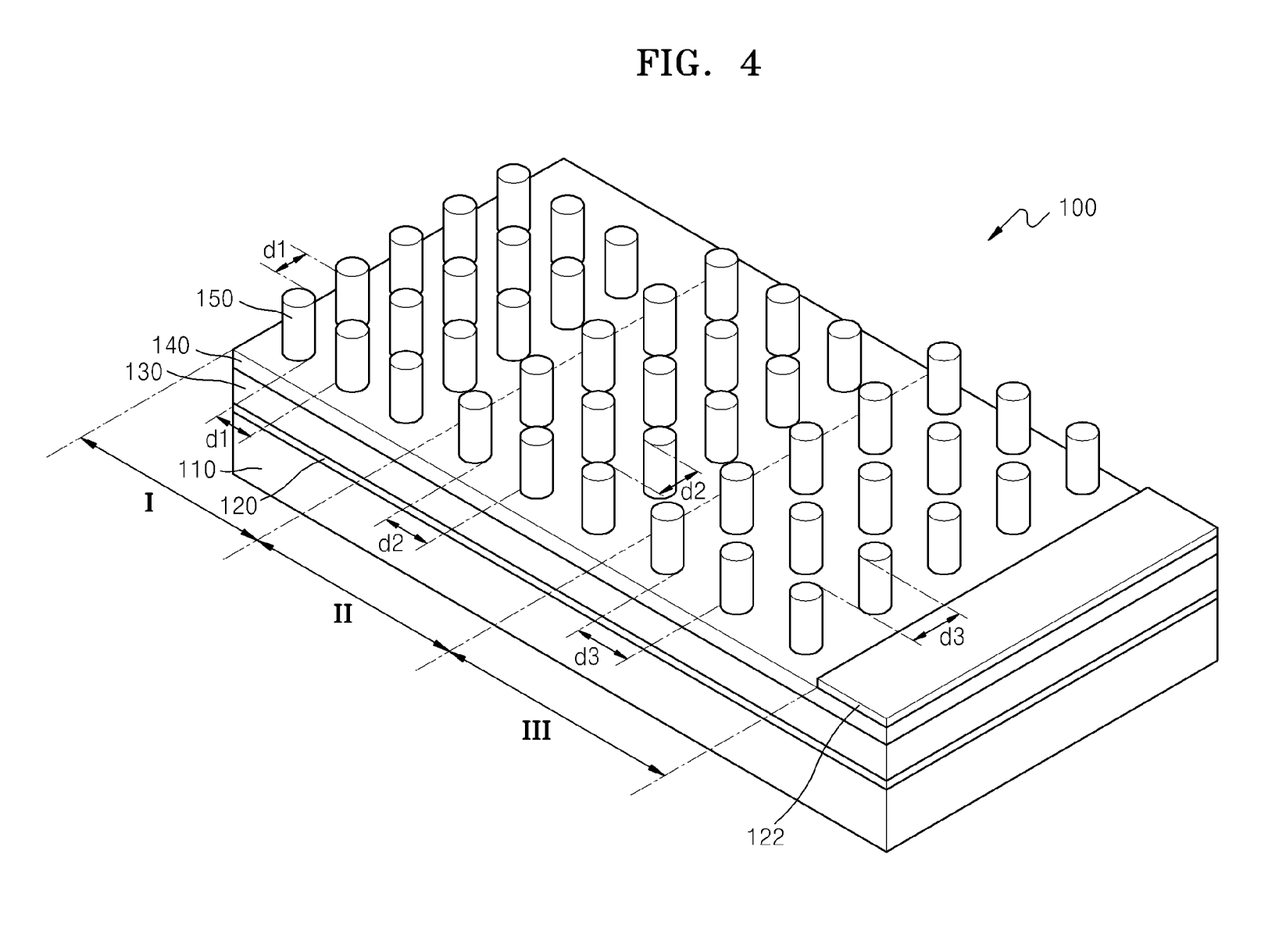
FIG. 4 is a perspective view of light emission according to an exemplary embodiment of the inventive concept.

FIG. 4 is a perspective view of a light-emitting device 100 according to an embodiment of the inventive concept. The light-emitting device 100 may be one of the plurality of light-emitting devices 100-1 to 100-5 illustrated in FIG. 1. The light-emitting device 100 includes a substrate 110, a first electrode pad 120 formed on the substrate 110, an epitaxial layer 130 formed on the first electrode pad 120, a plurality of nano-structured light-emitting units 150 formed on the epitaxial layer 130 in a direction perpendicular to a main surface of the substrate 110, and a second electrode pad 122 connected to the plurality of nano-structured light-emitting units 150. An insulating film pattern 140 is interposed between the plurality of light-emitting units 150 and the epitaxial layer 130.

The plurality of light-emitting units 150 may be formed of nano-sized cylindrical rod-shaped light-emitting diodes. The plurality of light-emitting units 150 may be formed to have a size of no more than 1 μm. According to the embodiment of the inventive concept, a cross-section of each of the plurality of light-emitting units 150 may have a diameter from about 200 nm to about 300 nm. In FIG. 4, the plurality of light-emitting units 150 are illustrated as being cylindrical. However, the inventive concept is not limited thereto. The plurality of light-emitting units 150 may take other shapes such as, for example, polygonal cone and pillar-shaped.

The plurality of light-emitting units 150 are separated from each other by different distances and may be divided into different groups in accordance with the distances among the light-emitting units 150 to generate light components with different wavelengths. The plurality of light-emitting units 150 may include a first group I in which the light-emitting units 150 are separated from each other by a first distance d1, a second group II in which the light-emitting units 150 are separated from each other by a second distance d2, and a third group III in which the light-emitting units 150 are separated from each other by a third distance d3 in accordance with the distances among the light-emitting units 150. A structure of the plurality of light-emitting units 150 and the wavelengths of the light components generated by the light-emitting units 150 in accordance with the distances among the light-emitting units 150 will be described in detail with reference to FIG. 5.

Figure 5:
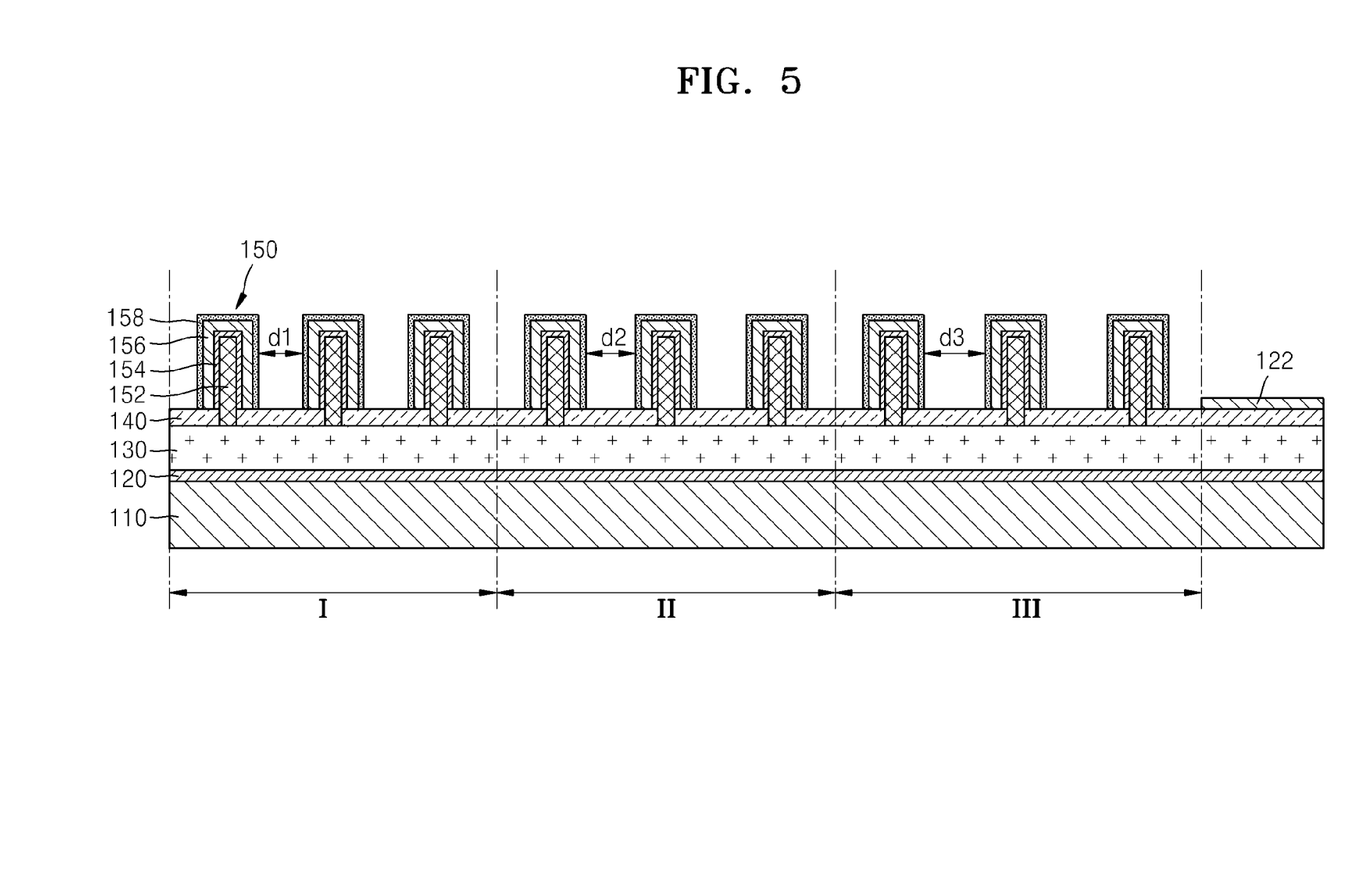
FIG. 5 is a cross-sectional view of the light-emitting device illustrated in FIG. 4.

FIG. 5 is a cross-sectional view of the light-emitting device 100 illustrated in FIG. 4. The substrate 110 may be formed of a semiconductor substrate including silicon (Si), germanium (Ge), silicon germanium (SiGe), silicon carbide (SiC), or gallium nitride (GaN). The substrate 110 may be removed after manufacturing the light-emitting device 100. Therefore, the substrate 110 may be selective.

Each of the plurality of light-emitting units 150 may include a first nitride-based semiconductor layer 152, an active layer 154, a second nitride-based semiconductor layer 156, and a transparent electrode layer 158 that are sequentially arranged in a radius direction from a center thereof to an edge thereof. The first nitride-based semiconductor layer 152, the active layer 154, the second nitride-based semiconductor layer 156, and the transparent electrode layer 158 are concentrically arranged on a plane. The first nitride-based semiconductor layer 152 may be formed to contact an upper surface of the epitaxial layer 130 on the substrate 110. The active layer 154 may be formed to cover a surface and circumference of the first nitride-based semiconductor layer 152 and to contact an upper surface of the insulating film pattern 140. The second nitride-based semiconductor layer 156 may be formed to cover a surface and circumference of the active layer 154 and to contact the upper surface of the insulating film pattern 140. In addition, the transparent electrode layer 158 may be formed to cover an external surface of the second nitride-based semiconductor layer 156 and to contact the upper surface of the insulating film pattern 140.

An insulating layer is formed on the epitaxial layer 130. The insulating layer is patterned to form the insulating film pattern 140 that exposes a part of the epitaxial layer 130. The insulating film pattern 140 may be formed of silicon oxide, silicon nitride, or a combination thereof. The first nitride-based semiconductor layer 152 that contacts the epitaxial layer 130 is formed in the region exposed by the insulating film pattern 140.

The first nitride-based semiconductor layer 152 is an n-type or p-type doped semiconductor layer and may be formed of an III-V group nitride semiconductor material. According to an embodiment of the inventive concept, the first nitride-based semiconductor layer 152 may be formed of n-type doped n-GaN. The epitaxial layer 130 may be interposed between the first nitride-based semiconductor layer 152 and the first electrode pad 120 and the first nitride-based semiconductor layer 152 may be electrically connected to the first electrode pad 120 through the epitaxial layer 130. In some embodiments, the epitaxial layer 130 may be formed of the same material as that of the first nitride-based semiconductor layer 152. The epitaxial layer 130 is not essential to light emission but is for the convenience of manufacturing processes of the light-emitting unit 150 and may easily grow the first nitride-based semiconductor layer 152 to be nanorod-shaped.

The active layer 154 generates light by recombination of electrons and holes. The active layer 154 may be formed of a nitride-based semiconductor layer including InGaN. An emission wavelength band of the active layer 154 may be controlled by controlling band-gap energy. According to an embodiment of the inventive concept, the active layer 154 may include a quantum well layer and a barrier layer formed of indium gallium nitride (InGaN)/GaN, InGaN/InGaN, InGaN/aluminum gallium nitride (AlGaN), or InGaN/InAlGaN. The quantum well layer may be formed of single quantum wells (SQW) or multi quantum wells (MQW).

The second nitride-based semiconductor layer 156 is an n-type or p-type doped semiconductor layer and may be formed of an III-V group nitride semiconductor material. According to an embodiment of the inventive concept, the second nitride-based semiconductor layer 156 may be formed of p-type doped p-GaN.

The transparent electrode layer 158 may be formed of a transparent conductive material and, according to an embodiment of the inventive concept, may be formed of indium tin oxide (ITO). The transparent electrode layer 158 may be electrically connected to the insulating film pattern 140 (refer to FIG. 4).

The plurality of light-emitting units 150 may include a first group I in which the light-emitting units 150 are separated from each other by a first distance d1, a second group II in which the light-emitting units 150 are separated from each other by a second distance d2, and a third group III in which the light-emitting units 150 are separated from each other by a third distance d3 in accordance with the distances among the light-emitting units 150. The plurality of light-emitting units 150 in the first group I, the second group II, and the third group III may generate light components with different wavelengths. Light with a first wavelength may be emitted by the light-emitting units 150 in the first group I where the light-emitting units 150 are separated from each other by the first distance d1. Light with a second wavelength may be emitted by the light-emitting units 150 in the second group II where the light-emitting units 150 are separated from each other by the second distance d2. Light with a third wavelength may be emitted by the light-emitting units 150 in the third group III where the light-emitting units 150 are separated from each other by the third distance d3. Since the first, second, and third wavelengths are different from each other, light components with different colors may be generated. According to an embodiment of the inventive concept, the first distance d1 may be from about 1.0 µm to about 1.2 µm, the second distance d2 may be from about 1.4 µm to about 1.7 µm, and the third distance d3 may be from about 1.9 µm to about 2.2 µm. The first wavelength may be from about 430 nm to about 470 nm, the second wavelength may be from about 490 nm to about 560 nm, and the first wavelength may be from about 580 nm to about 640 nm. Therefore, the light-emitting units 150 in the first group I may generate light with a short wavelength, that is, blue light, the light-emitting units 150 in the second group II may generate green light, and the light-emitting units 150 in the third group III may generate light with a long wavelength, that is, red light. As described above, the distances among the plurality of light-emitting units 150 may be controlled to generate light components with three or more wavelengths. As described with reference to FIGS. 2 and 3, since the wavelength of the emitted light varies with the increase in the value of the current applied to the light-emitting device 100, the distances among the plurality of light-emitting units 150 may be controlled to be different from each other to form the light-emitting device 100 so that degrees of emission of the respective wavelengths may be controlled and CCT may vary in accordance with a combination of the light components with the respective wavelengths. Specifically, when the value of the current applied from the outside to the light-emitting device 100 is small, for example, when the current value is from about 0 mA to about 20 mA, light is generated by only the light-emitting units in the third group III that generate light with the long wavelength so that illumination having low brightness and low CCT of about 3,000K may be formed. When the current value is from about 20 mA to about 150 mA, light is also generated by the light-emitting units in the second group II so that illumination having CCT of no less than 3,000K may be formed. When the current value is no less than 150 mA, light is generated by all the light-emitting units in the first to third groups I to III so that illumination having high brightness and high CCT of about 6,500K may be formed by a combination of the plurality of wavelengths.

On the other hand, in order to emit the light components with the different wavelengths, the active layers 154 in the plurality of light-emitting units 150 may be formed of MQWs. According to an embodiment of the inventive concept, the active layer 154 may have a MQW structure formed of a plurality of quantum wells and a barrier layer. At this time, the plurality of light-emitting units 150 generate the light components with the different wavelengths in accordance with the groups so that CCT may be controlled by the combination of the light components with the different wavelengths.

The wavelengths of the light components generated by the plurality of light-emitting units 150 may be implemented by changing a composition of a material that forms the quantum wells. According to an embodiment of the inventive concept, the active layer 154 may include InGaN. The active layer 154 of the MQW including InGaN may generate light components with different wavelengths in accordance with a composition ratio, that is, a molar fraction of In. In general, when the molar fraction of In changes by 1%, an emission wavelength changes by about 5 nm. For example, when blue light is to be generated, the molar fraction of In of the quantum wells of the active layer 154 is to be about 20%. In addition, when green light is to be generated, the molar fraction of In of the quantum wells of the active layer 154 is to be about 40%. When red light is to be generated, the molar fraction of In of the quantum wells of the active layer 154 is to be about 60%. In some embodiments, cadmium zinc oxide (CdZnO) may be used as the quantum wells. In this case, a molar fraction of Cd of the quantum wells may be changed to control the emission wavelength. Therefore, light components with various wavelengths may be emitted by a single light-emitting device without using a fluorescent substance and CCT may be controlled by a combination of the light components with the various wavelengths.

Figure 6:
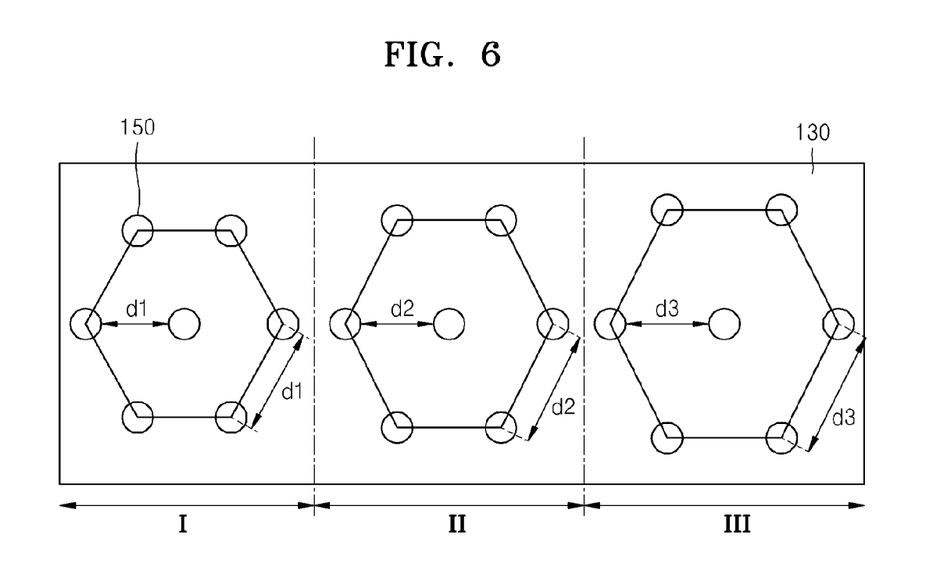
FIG. 6 is a plan view of the light-emitting device illustrated in FIG. 4.

FIG. 6 is a plan view illustrating an arrangement structure of the light-emitting device 100 illustrated in FIG. 4. As shown, the bottom surfaces of the plurality of light-emitting units 150 may be separated from each other by a predetermined distance to be hexagonally arranged. The plurality of light-emitting units 150 may include the first group I in which the light-emitting units 150 are separated from each other by the first distance d1, the second group II in which the light-emitting units 150 are separated from each other by the second distance d2, and the third group III in which the light-emitting units 150 are separated from each other by the third distance d3 in accordance with the distances among the light-emitting units 150. All the light-emitting units in the first to third groups I to III may be hexagonally arranged in order to improve emission efficiency. However, the inventive concept is not limited thereto. The plurality of light-emitting units 150 may be arranged in a verity of alternative manners such as, for example, linearly arranged or may be arranged in zigzags whenever a column is changed.

Figure 7:
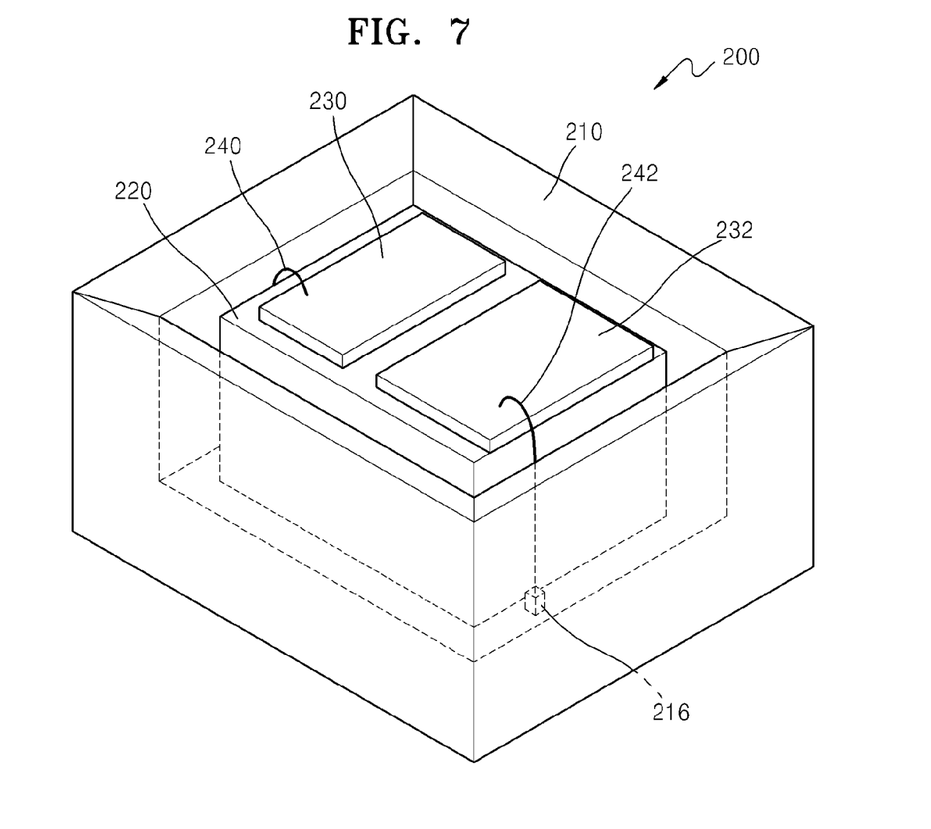
FIG. 7 is a perspective view of a light-emitting device according to another exemplary embodiment of the inventive concept.

FIG. 7 is a perspective view of a light-emitting device 200 according to another embodiment of the inventive concept. The light-emitting device 200 may be one of the plurality of light-emitting devices 100-1 to 100-5 illustrated in FIG. 1.

The light-emitting device 200 includes a base member 210 in which the light-emitting device 200 is mounted, a substrate 212 (refer to FIG. 8), a light-emitting unit 220, a first electrode pad 230, and a second electrode pad 232. The substrate 212 and the light-emitting unit 220 are sequentially mounted on an upper surface of a center of the base member 210. The base member 210 may be formed to be concave so that both side walls thereof may form inclined surfaces.

The first electrode pad 230 and the second electrode pad 232 formed on an upper surface of the light-emitting unit 220 may be wire 240 and 242 bonded to connection terminals 216 formed on the base member 210 to receive an electrical signal from the outside. The light-emitting device 200 may receive the control signal from the controller illustrated in FIG. 1 in accordance with an environment in which an illumination apparatus using the light-emitting device 200 is installed so that current may be applied from the driving circuit unit to the light-emitting unit 220 through the base member 210, the connection terminals 216, and the wire 240. In FIG. 7, the first electrode pad 230 and the second electrode pad 232 formed on the upper surface of the light-emitting unit 220 are illustrated as being wire bonded. However, the inventive concept is not limited thereto and various modifications may be formed as occasion demands. For example, in some embodiments, the light-emitting unit 220, the first electrode pad 230, and the second electrode pad 232 may be connected by a through-silicon via (TSV).

Figure 8:
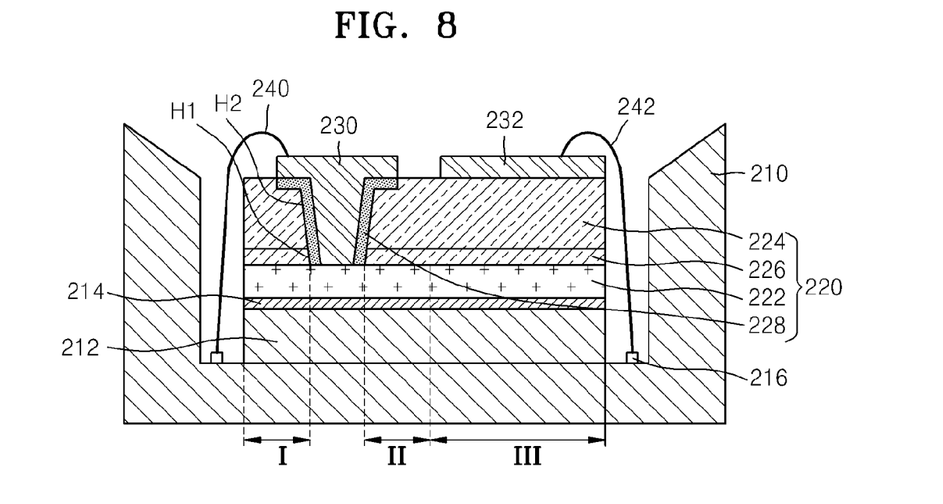
FIG. 8 is a cross-sectional view of the light-emitting device illustrated in FIG. 7.

FIG. 8 is a cross-sectional view of the light-emitting device 200 illustrated in FIG. 7. As shown, the substrate 212 may be an insulating substrate such as a glass substrate or a sapphire substrate or may be a conductive substrate including Si, Ge, SiGe, SiC, and ZnO. A buffer layer 214 may be formed on the substrate 212. The buffer layer 214 may be formed to resolve lattice mismatch between the substrate 212 and a first nitride-based semiconductor layer 222. The buffer layer 214 may be formed of, for example, InAlGaN or SiC. In some embodiments, the buffer layer 214 may be omitted.

The first nitride-based semiconductor layer 222 is formed on an upper surface of the buffer layer 214. The first nitride-based semiconductor layer 222 is an n-type or p-type doped semiconductor layer and may be formed of an III-V group nitride semiconductor material. According to an embodiment of the inventive concept, the first nitride-based semiconductor layer 222 may be formed of n-type doped n-GaN.

An active layer 226 generates light by recombination of electrons and holes and is formed on an upper surface of the first nitride-based semiconductor layer 222. The active layer 226 may be formed of MQWs including InGaN. An emission wavelength band of the active layer 226 may be controlled by controlling band-gap energy. The active layer 226 includes a via hole H1. A lower portion of the first electrode pad 230 is formed in a space limited by the via hole H1. An electrode pad insulating film 228 is formed between the via hole H1 and the lower portion of the first electrode pad 230.

A second nitride-based semiconductor layer 224 is an n-type or p-type doped semiconductor layer and may be formed of an III-V group nitride semiconductor material. According to an embodiment of the inventive concept, the second nitride-based semiconductor layer 224 may be formed of p-type doped p-GaN. The second nitride-based semiconductor layer 224 includes a via hole H2 like the active layer 226. An upper portion of the first electrode pad 230 is formed in a space limited by the via hole H2. The electrode pad insulating film 228 is formed between the via hole H2 and the first electrode pad 230.

As described above, the first electrode pad 230 is formed to fill the via holes H1 and H2 and to cover an upper portion of the second nitride-based semiconductor layer 224. A lower surface of the first electrode pad 230 is electrically connected to the first nitride-based semiconductor layer 222. The electrode pad insulating film 228 is formed between the first electrode pad 230 and the second nitride-based semiconductor layer 224. The first electrode pad 230 is connected to the base member 210 through the wire 240 and may supply current applied from the outside to the first nitride-based semiconductor layer 222.

The second electrode pad 232 is formed to contact an upper surface of the second nitride-based semiconductor layer 224 and is electrically connected to the second nitride-based semiconductor layer 224. The wire 242 is formed on an upper surface of the second electrode pad 232. The second electrode pad 232 is connected to the base member 210 through the wire 242. The second electrode pad 232 may supply the current applied from the outside to the second nitride-based semiconductor layer 224.

The active layer 226 may continuously generate light components with various wavelength bands in accordance with the value of the applied current. Specifically, when the value of the applied current is small, red light with a long wavelength is emitted by the active layer 226. As the value of the applied current gradually increases, blue light with a short wavelength is simultaneously emitted by the active layer 226. According to an embodiment of the inventive concept, the value of the current applied from the outside is from about 0 mA to about 200 mA. Low current may have a value from about 0 mA to about 20 mA. Intermediate current may have a value from about 20 mA to about 150 mA. High current may have a value of no less than 150 mA.

According to an embodiment of the inventive concept, the active layer 226 may include InGaN. The active layer 226 of the MQW including InGaN may generate light components with different wavelengths in accordance with a composition ratio, that is, a molar fraction of In. In $In_xGa_{(1-x)}N$ included in the active layer 226, x may have a value from about 0.1 to about 0.6. That is, In may have a molar fraction from about 10% to about 60% with respect to the entire active layer 226.

The active layer 226 may be divided into a first region I, a second region II, and a third region III in accordance with the molar fraction of In. According to an embodiment of the inventive concept, the molar fraction of In in the first region I may be about 0.15, the molar fraction of In in the second region II may be from about 0.15 to about 0.6, and the molar fraction of In in the third region III may be about 0.6. However, the inventive concept is not limited thereto and the molar fraction of In may be evenly determined. Since a band-gap is reduced as the molar fraction of In in the active layer 226 is larger so that an emission wavelength is increased, red light with a long wavelength may be generated. According to an embodiment of the inventive concept, light with a wavelength from about 430 nm to about 470 nm may be generated by the active layer 226 in the first region I, light with a wavelength from about 490 nm to about 560 nm may be generated by the active layer 226 in the second region II, and light with a wavelength from about 580 nm to about 640 nm may be generated by the active layer 226 in the third region III. Blue light with a short wavelength may be generated by the active layer 226 in the first region I, green light may be generated by the active layer 226 in the second region II, and red light with a long wavelength may be generated by the active layer 226 in the third region III. As described above, the composition ratios of In of the active layer 226 may be made different from each other so that wavelengths of emitted light components may be made different from each other. Therefore, as illustrated in FIGS. 2 and 3, the wavelength of the emitted light varies with the increase in the current applied to the light-emitting device 200 so that CCT may be controlled by the combination of the light components with the different wavelengths.

In accordance with the value of the current applied from the outside, the CCT of the light components generated by the light-emitting device 200 may have a value from about 2,500K to about 7,500K. Since the values of the CCT in accordance with the value of the current applied from the outside to the light-emitting device 200 are the same as described with reference to FIG. 5, repeated description thereof will not be given.

In some embodiments, the active layer 226 may include CdZnO In this case, the molar fraction of Cd of the active layer 226 may be changed to control the emission wavelength and the CCT.

While the inventive concept has been particularly shown and described with reference to exemplary embodiments thereof, it will be understood that various changes in form and details may be made therein without departing from the spirit and scope of the following claims.

What is claimed is:

1. A light-emitting device comprising:
   a plurality of light-emitting units each including an active layer of multi quantum wells (MQW), and including a first group of light-emitting units emitting light having a first wavelength, a second group of light-emitting units emitting light having a second wavelength, the second wavelength being greater than the first wavelength; and
   an electrode unit electrically connected to the plurality of light-emitting units,
   wherein brightness and correlated color temperature (CCT) of light components generated by the plurality of light-emitting units simultaneously increase in accordance with an increase in an amount of current applied by an external input power source connected to the light-emitting units through the electrode unit, and
   the second, and first groups of light-emitting units are sequentially turned on in response to the increase in the amount of current applied by the external input power source.

2. The light-emitting device of claim 1, wherein the CCT automatically changes in a range between 2,500K and 7,500K in accordance with a change in the amount of the current applied by the external input power source.

3. The light-emitting device of claim 1,
   wherein the plurality of light-emitting units are nano-structured, and
   wherein MQWs in the plurality of light-emitting units generate light components with different wavelengths including the first and second wavelengths so that the CCT changes in accordance with a combination of the light components with the different wavelengths.

4. The light-emitting device of claim 3,
   wherein the light-emitting units of the first group are separately arranged by a first distance, and the light-emitting units of the second group are separately arranged by a second distance, and
   wherein the second distance is greater than the first distance.

5. The light-emitting device of claim 3,
   wherein the plurality of light-emitting units comprise InGaN, and
   wherein the plurality of light-emitting units generate the light components with the different wavelengths in accordance with composition ratios of In.

6. The light-emitting device of claim 3,
   wherein the plurality of light-emitting units comprise InGaN,
   wherein In contained in the light-emitting units of the first group has a first composition ratio, and In contained in the second light-emitting units of the second group has a second composition ratio, and
   wherein the second composition ratio is greater than the first composition ratio.

7. The light-emitting device of claim 1,
   wherein the light-emitting unit is formed of a thin film and further comprises a first nitride-based semiconductor layer formed under the active layer and a second nitride-based semiconductor layer formed on the active layer,
   wherein the active layer comprises InGaN,
   wherein the active layer comprises first, second, and third regions in which composition ratios of In included therein are different from each other,
   wherein the active layer in the first, second, and third regions generates light components with the first, second, and third wavelengths, and
   wherein the CCT changes in accordance with a combination of the light components with the first, second, and third wavelengths.

\* \* \* \* \*